United States Patent [19]

Kitagawa et al.

[11] 4,072,932

[45] Feb. 7, 1978

[54] CLOCK GENERATOR FOR SEMICONDUCTOR MEMORY

[75] Inventors: Norihisa Kitagawa; Lionel Stuart White, Jr., both of Houston, Tex.

[73] Assignee: Texas Instruments Incorporated, Dallas, Tex.

[21] Appl. No.: 716,907

[22] Filed: Aug. 23, 1976

[51] Int. Cl.² .................. G11C 11/40; H03K 17/00
[52] U.S. Cl. ........................... 365/233; 307/269; 365/154; 365/207
[58] Field of Search ............... 307/269, 279, 293; 340/173 R, 173 FF

[56] References Cited

U.S. PATENT DOCUMENTS 3,855,483  12/1974  Karp et al. ............... 340/173 AD Primary Examiner—Terrell W. Fears
Attorney, Agent, or Firm—James T. Comfort; Charles J. Fassbender

[57] ABSTRACT

Disclosed is a read clock generator for use in a semiconductor memory. The read clock generator is comprised of a bistable amplifier and a differential voltage sensor. The bistable amplifier is activated during a read cycle; and it simulates the transient operation of a plurality of sense amplifiers which sense binary information stored within the memory. The differential voltage sensor couples to the bistable amplifier, and produces an output signal when the bistable amplifier stabilizes.

12 Claims, 4 Drawing Figures

CLOCK GENERATOR FOR SEMICONDUCTOR MEMORY

BACKGROUND OF THE INVENTION

This invention relates to a semiconductor memory, and more particularly to a differential read-clock generator within a memory chip.

Semiconductor memories are commercially available in a wide range of storage capacity and operating speeds. Typically, the storage capacity of semiconductor memory chips is standardized at 16 bits, 256 bits, 512 bits, 1024 bits, 2048 bits, 4096 bits, 8192 bits, or 16,284 bits. But these chips are combined in a countless variety of ways to form many different sized memories.

The operating speed of a memory generally refers to the memory's read time, and write time. Read time refers to the time interval required to access data from the memory, and write time refers to the time interval required to write data into the memory. The speed at which these operations can be performed is critical because the trend over the last 10 years of the digital equipment which uses these memories, has been to continually require higher operating speeds. Therefore, much effort has been spent in the semiconductor industry to develop higher speed memories.

Several factors influence the read time of a semiconductor chip. In the past, one factor was a time delay that occurred between the stabilization of the sense amplifiers within the memory chip, and the gating of the sense amplifier's output to the data output lead on the chip. This time delay was purposely inserted to ensure that the sense amplifiers had stabilized before their output was gated. The capacitive loading on the sense amplifiers is delicately balanced during a read operation, and this balance would be upset and result in read errors if the sense amplifiers were gated before they stabilized.

This time delay typically was implemented by an R-C read-clock generator, which utilized two transistors, A and B, and a capacitor to act as an R-C timing network. Transistor A had a source coupled to a voltage source $V_{dd}$, and had a drain coupled to a node N. Transistor B had a source coupled to node N and had a drain coupled to ground. The capacitor also coupled between node N and ground.

Prior to a read operation, transistor A was turned on and the capacitor was thus charged. During a read operation, transistor B was turned on and the capacitor was thus discharged. The discharge time was designed to be longer than the time it took the sense amplifiers to stabilize; and the sense amplifiers were gated when the discharge completed.

One problem with this R-C read-clock generator was that the R-C time constant always had to be made significantly larger, rather than equal to, the stabilization time of the sense amplifiers. This was because the timing parameters of the R-C network and the sense amplifiers were impossible to match exactly due to the different architecture of the two circuits. Sense amplifiers are basically a differential voltage sensory device, rather than a simple R-C discharge network. This difference in architecture also caused the timing parameters of two circuits to behave differently with respect to temperature changes. The result was that the read time of the memory chip was undesirably long.

It is, therefore, one object of the invention to provide a memory with an improved read time.

Another object of the invention is to provide an improved memory read-clock generator.

Another object of the invention is to provide a read clock generator with a differential voltage sensing architecture.

A further object of the invention is to provide a read clock generator which produces an output signal within a few nano-seconds of the time when the sense amplifiers have stabilized.

Still another object of the invention is to provide a read clock generator with timing parameters that vary with temperatures similar to the timing parameters of the sense amplifiers.

BRIEF SUMMARY OF THE INVENTION

These and other objects are accomplished in accordance with the invention in which a bistable amplifier is coupled to a differential voltage sensing transistor. The bistable amplifier has an architecture similar to the memory sense amplifiers. Thus, the two circuits have similar timing characteristics. The bistable amplifier is activated by a clock signal at the same instant the memory sense amplifiers are activated. Therefore, both circuits stabilize at nearly the same instant. The differential voltage sensing transistor senses when the bistable circuit has stabilized and produces an output signal to indicate stabilization occurred.

BRIEF DESCRIPTION OF THE DRAWINGS

The novel features believed characteristic of the invention are set forth in the appended claims; the invention itself, however, as well as other features and advantages thereof, will best be understood by reference to the following detailed description of particular embodiments, read in conjunction with the accompanying drawings, wherein:

FIG. 2A is a circuit diagram illustrating an example of one particular sense amplifier which may be used in the block diagram of FIG. 2.

DETAILED DESCRIPTION OF SPECIFIC EMBODIMENTS

Figure 1:
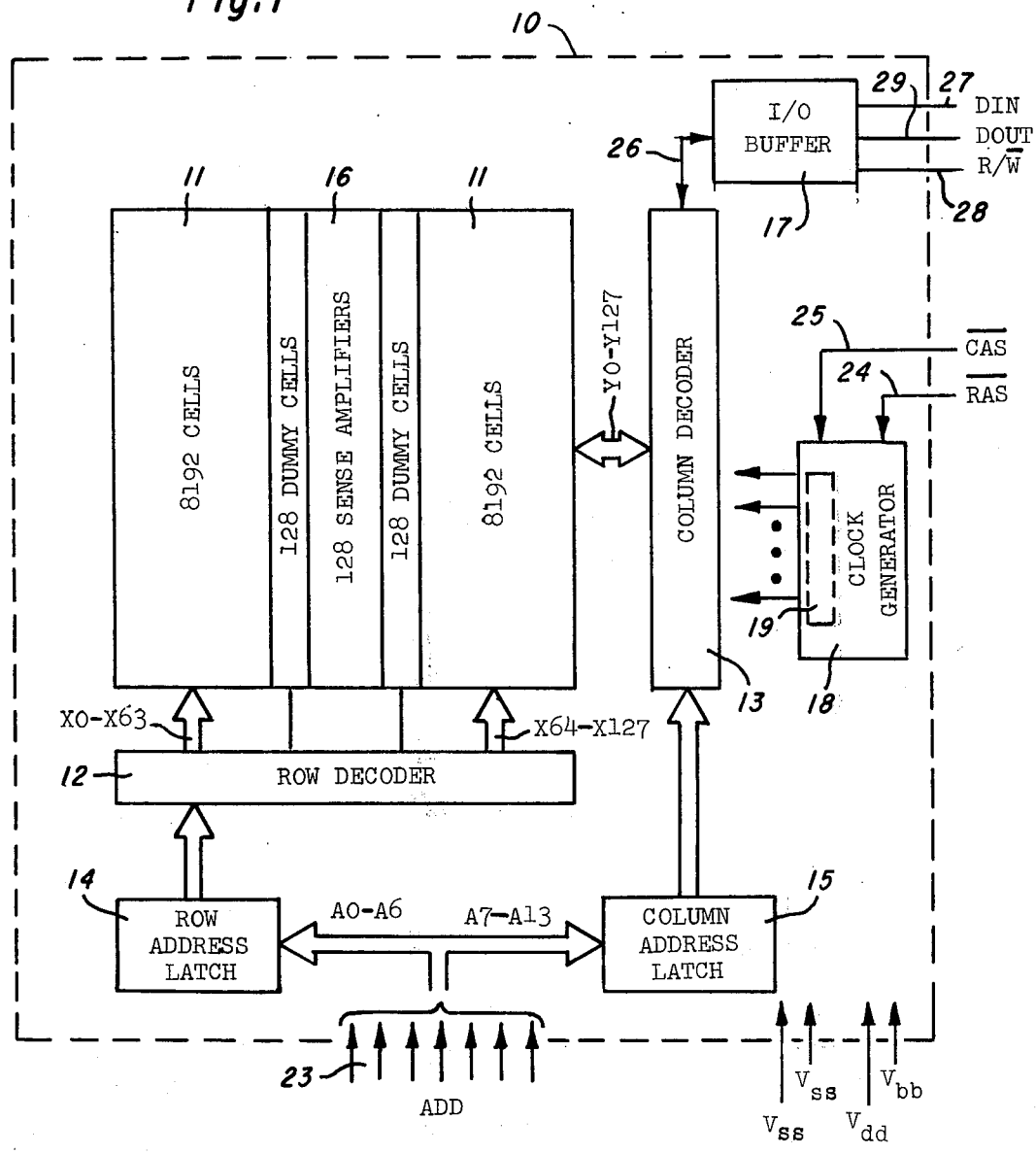
FIG. 1 is a block diagram of a memory device which utilizes the differential read-clock generator.

Referring to FIG. 1, an MOS memory chip 10 which uses the invention, is illustrated. The chip consists basically of an array of memory cells, 11, a row decoder 12, a column decoder 13, a row address latch 14, a column address latch 15, several sense amplifiers 16, an I/O buffer 17, and a clock generator 18 which includes a differential read clock generator 19 constructed according to the invention.

Array 11 provides storage for binary information and may be of various sizes. This particular array contains 16,384 memory cells divided into 128 rows and 128 columns. Row decoder 12 selects one of the 128 row lines X0 – X127 as determined by a row address contained in latch 14. Similarly, column decoder 15 selects one of the 128 column lines Y0 – Y127 as determined by a column address contained in latch 15. These addresses are applied to chip 10 by seven address lines 23 on a time share basis. A "Row Address Strobe" or $\overline{RAS}$ input 24 enables row latch 14 to accept the address on lines 23, while a "Column Address Strobe" or $\overline{CAS}$ input 25 enables column latch 15 to accept the address on line 23.

Data is transferred between an addressed cell in array 11 and I/O buffer 17 via the columns lines Y- - Y127 and one signal line 26. Clock generators 18 and 19 provide clock signals $\phi 1$, $\phi 2$, ... etc. which are used to synchronize this data transfer. In particular, clock generator 19 is activated during a read operation to generate a clock signal that indicates when the sense amplifiers 16 have completed sensing the information in a selected cell. This clock signal is used to gate the information on the selected column line onto signal line 26, and then into I/O buffer 17. Data in buffer 17 is sensed externally over a D output 27, under control of an $R/\overline{W}$ line 28. A data input line 29 is used to load the buffer 17 from an external source when data is being written into a selected cell.

Figure 2:
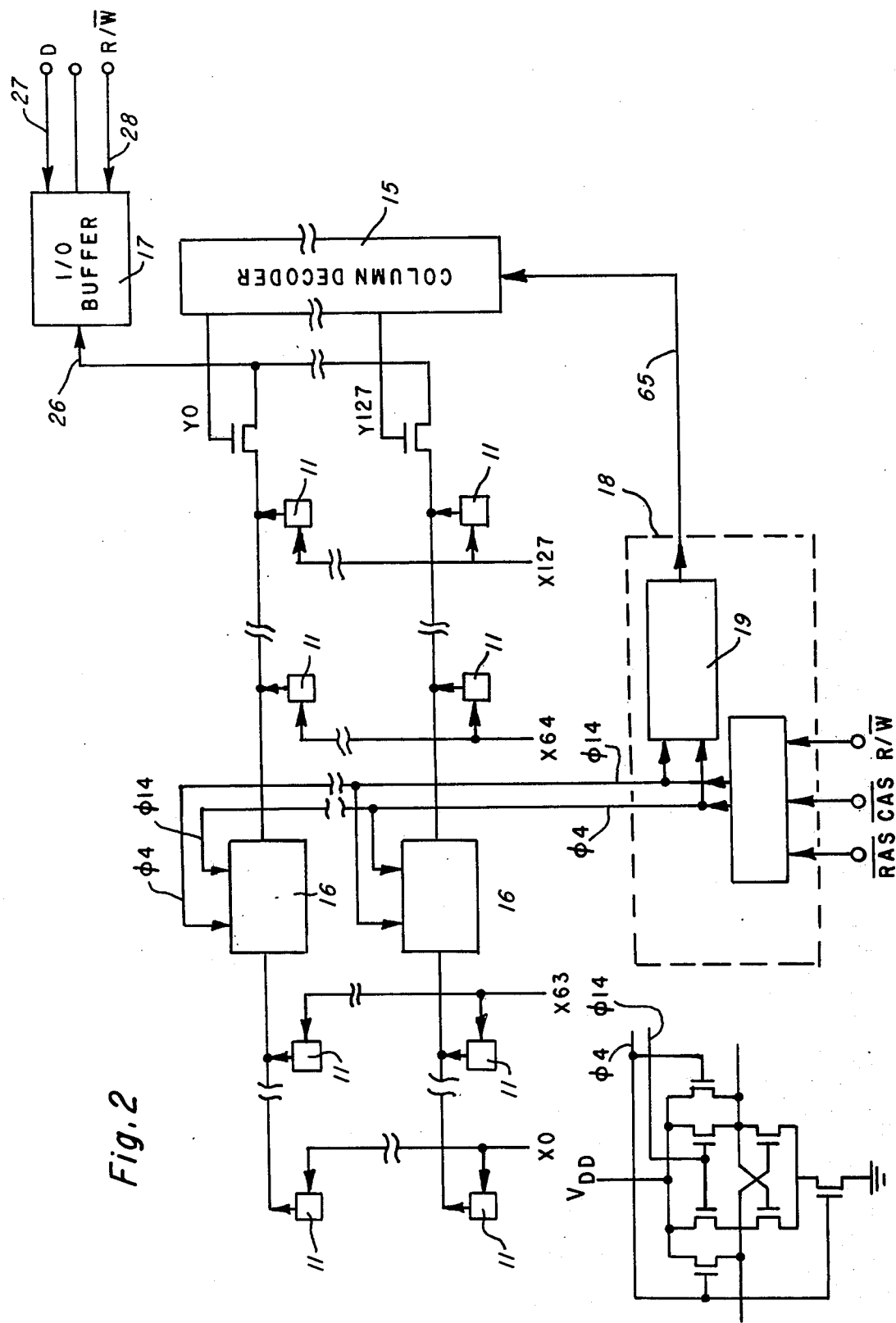
FIG. 2 is a block diagram of the interconnections to the differential read-clock generator, as utilized by the device of FIG. 1.

Referring to FIG. 2, a detailed block diagram of the data paths and clock paths in memory device 10, that are used during a memory read operation, is illustrated. A read operation is externally initiated by a particular signal sequence on the $\overline{RAS}$, $\overline{CAS}$, and $R/\overline{W}$ lines. This sequence activates clock generator 18 which causes clocks 1 4 and $\phi 14$ to enter a state that signifies a read operation. Signals $\phi 4$ and $\phi 14$ are received by sense amplifiers 16 and by differential read-clock generator 19. Sense amplifiers 16 respond to signals $\phi 4$ and $\phi 14$ by sensing the information stored in the cells of the addressed row, and by placing this information on the column lines Y0 - Y127. FIG. 2A illustrates the particular sense amplifier circuit as an example. Another example of a sense amplifier circuit may be found in a co-pending application with Ser. No. 691,734, filed June 1, 1976, by Kitagawa and White. Clock generator 19 responds to signals $\phi 4$ and $\phi 14$ by initiating a clock generation operation. Generator 19 has an output lead 65 which couples to column decoder 15. Decoder 15 senses the output voltage V65 on lead 65 and responds by gating the memory cell information on the selected column line onto signal line 26. The signal on line 26 is then latched by I/O buffer 17 and is externally sensed over line 27.

The timing relationship, in the above described read operation, between the stabilization of sense amplifiers 16 and the gating of the selected column line onto line 26 is critical. If the selected column line is gated onto line 26 before sense amplifiers 16 stabilize, errors will occur. This is because lead 65 has a large intrinsic capacitance (since it connects to every column line gating transistor) and this capacitance wll unbalance the sense amplifiers thereby causing improper stabilization. On the other hand, if the selected column line is gated onto line 26 long after sense amplifiers 16 have stabilized, the access time of memory device 10 is needlessly increased. The object then is to provide a signal on lead 65 which indicates the instant sense amplifiers 16 have stabilized, and to use this signal to immediately gate the selected column line onto lead 65. The function of generator 19 is to provide such a signal.

Figure 3:
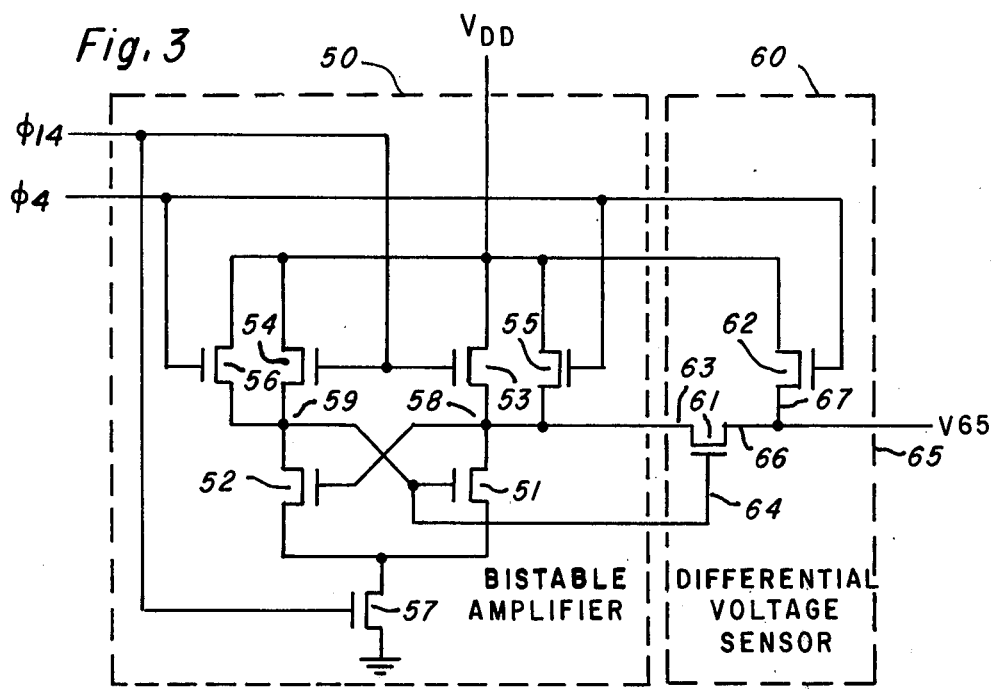
FIG. 3 is a circuit diagram of a specific embodiment of the differential read-clock generator.

Referring to FIG. 3, a circuit diagram of a specific embodiment of differential read-clock generator 19 is illustrated. Generator 19 consists basically of a bistable amplifier 50, and a differential voltage sensor 60. The purpose of bistable amplifier 50 is to provide a circuit having timing characteristics that are very similar to those of sense amplifiers 16 and the purpose of differential voltage sensor 60 is to provide an output signal V65 which indicates when amplifier 50 has reached a stable state.

Amplifier 50 consists primarily of a set transistor 51, a reset transistor 52, a pair of load transistors 53 and 54, a pair of precharge transistors 55 and 56, and a discharge transistor 57. Set and reset transistors 51 and 52 are cross-coupled to form set and reset nodes 58 and 59 respectively. The nodes 58 and 59 are intentionally unbalanced by selection of the device ratios (channel length to width), or alternatively the set node 58 is constructed in a manner which makes its capacitance slightly smaller than the capacitance of reset node 59. Also, both of the unbalance techniques may be used.

Set node 58 is further coupled to load transistor 53 and precharge transistor 55. Similarly reset node 59 is further coupled to load transistor 54 and precharge transistor 56. This architecture is quite similar to the architecture of sense amplifiers 16, and this similarity enables the two circuits to also have very similar timing characteristics.

Differential voltage sensor 60 consists primarily of a differential voltage sensing transistor 61, and a precharge transistor 62. Transistor 61 has a drain 63 coupled to set node 58, and has a gate 64 coupled to reset node 59. An output lead 64 couples to the source 66 of transistor 61 and to the drain 67 of precharge transistor 62.

The mode of operation of clock generator 19 is controlled by clocks $\phi 4$ and $\phi 14$. Clock $\phi 4$ couples to the gates of precharge transistors 55, 56, and 62; and its function is to enable or disable a precharge operation. Clock $\phi 14$ couples to the gates of transistors 53, 54, and 57; and its function is to activate clock generator 19 and thereby generate output clock signal V65.

Figure 4:
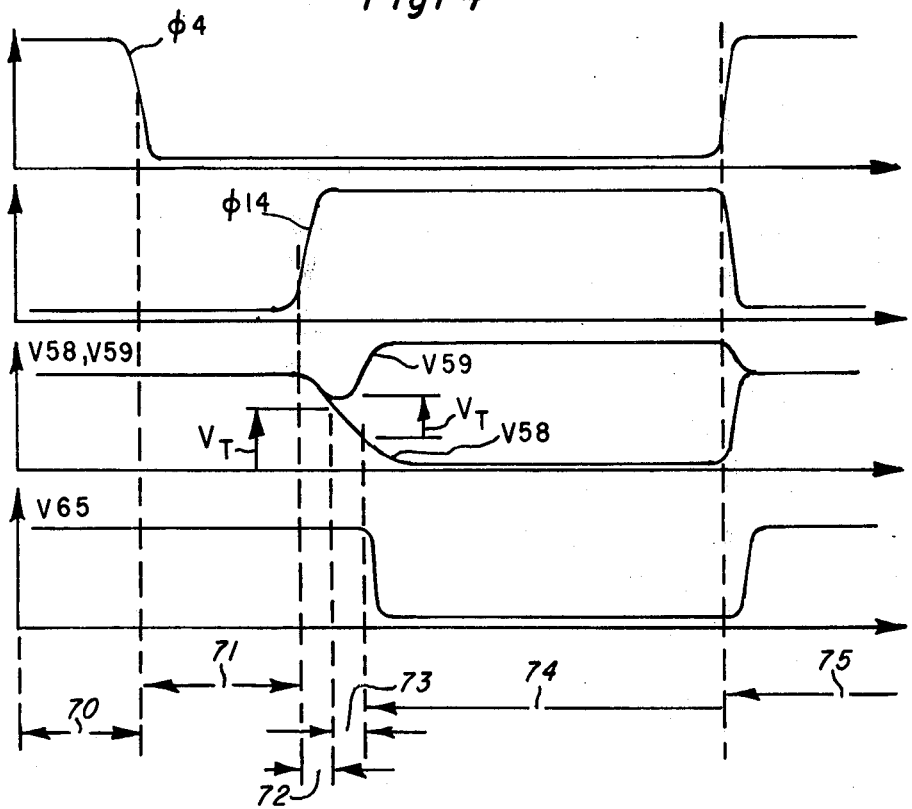
FIG. 4 is a timing diagram illustrating the voltages on various nodes within the circuit of FIG. 3.

The detailed manner in which clocks $\phi 4$ and $\phi 14$ are sequenced and the resulting voltages within clock generator 19 are illustrated in FIG. 4. During an initial time interval 70, clock $\phi 4$ is at a logical "1" state, and clock $\phi 14$ is at a logical "0" state. The logical "1" state, of clock $\phi 4$ turns on transistor 56, and thus the voltage V59 on node 59 is raised to a potential that is one threshold drop (Vt) below the voltage of signal $\phi 4$. Similarly, the voltage V58 on node 58 and the voltage V65 on lead 65 is also raised to one threshold drop below the voltage level of clock $\phi 4$.

During a second time interval 71, clocks $\phi 4$ and $\phi 14$ are both at a logical "0" state. Thus, transistors 53, 54, 55, 56, 57, 61, and 62 turn off; and the precharge voltages V58, V59, and V65 remain at the value acquired during time interval 70.

During a third time interval 72, clock $\phi 14$ goes to a logical "1" state while clock $\phi 4$ remains in a logical "0" state. This initiates a memory cell sensing operation in sense amplifiers 16 because clock $\phi 4$ couples to the load transistors of sense amplifiers 16; and clock $\phi 4$ simultaneously initiates a clock generation operation in clock generator 19. Details of this clock generating operation are as follows:

The logical "1" state of signal $\phi 4$ turns on discharge transistor 57, and discharge paths are thereby provided for set node 58 and reset node 59. Set node 58 discharges through transistors 57 and 51, while reset node 59 simultaneously discharges through transistors 57 and 52. As previously pointed out however, node 58 has a smaller capacitance than node 59. Therefore, node 58 discharges at a faster rate than node 59 discharges.

When the voltage on node 58 drops to a level which is one threshold level above ground, transistor 52 turns off and thus node 59 stops discharging.

During time interval 73, node 59 charges through load transistor 54, and node 58 continues to discharge through transistors 57 and 51. Thus, the voltage difference between nodes 58 and 59 grows and soon reaches a magnitude of one threshold level.

During time interval 74, the voltage difference between nodes 58 and 59 is greater than one threshold lever, and thus differential voltage sensing transistor 61 turns on. Therefore, the precharge on lead 65 discharges through transistors 61, 51, and 57 and voltage V65 drops to nearly ground voltage level.

The negative transition of V65 occurs within a few nano-seconds of the instant when the sense amplifiers 16 latch up. This close time correlation exists because 1) clock signal $\phi14$ simultaneously initiates clock generator 19 and sense amplifiers 16; 2) both circuits utilize a bistable amplifier of similar architecture and thus of similar timing parameters; 3) bistable amplifier 50 latches when voltage V59 is one Vt greater than V58; and 4) differential voltage sensing transistor 61 switches when bistable amplifier 50 is latched.

Lead 65 remains at a low voltage level, until clock $\phi4$ goes to a logical "1" state and clock $\phi14$ goes to a logical "0" state. When this occurs, a time interval 75 is entered in which the precharge voltages, of time interval 70 are restored.

Various embodiments of the invention have now been described in detail. Since it is obvious that many changes and modifications can be made in the above details without departing from the nature and spirit of the invention, it is understood that the invention is not to be limited to said details except as set forth in the appended claims.

What is claimed is:

1. A semiconductor memory comprised of:
   a. an array of memory cell means for storing binary information,
   b. a plurality of sense amplifier means coupled to said array of memory cell means for reading selectable portions of said memory information in response to control signals, and
   c. read-clock generator means for generating output signals indicating when said plurality of sense amplifier means has stabilized during said reading wherein said generator means includes timing circuit means having inputs coupled to receive said control signals and having substantially the same architecture as said sense amplifier means for simulating during said reading the transient operation of said sense amplifiers and for generating said output signals indicating when said timing circuit is stable.

2. A semiconductor memory according to claim 1, wherein said timing means and said sense amplifier means are comprised of intercoupled MOS transistors.

3. A semiconductor memory according to claim 2, wherein said timing means and said sense amplifier means are comprised of bi-stable cross-coupled MOS amplifier means.

4. A semiconductor memory according to claim 3, wherein each of said bi-stable amplifier means is comprised of a set transistor cross-coupled to a reset transistor, said cross-coupling forming set and reset nodes, said nodes within said timing means being unbalanced.

5. A semiconductor memory according to claim 4, further including a differential voltage sensing means coupled to said set and reset nodes within said timing means for generating said output signal in response to the voltage on said set node being more than one MOS threshold different than the voltage on said reset node.

6. A semiconductor memory according to claim 5, wherein said differential voltage sensing means is comprised of an MOS transistor having a gate coupled to said reset node and having a drain coupled to said set node.

7. In a semiconductor binary memory comprised of arrays of cells for storing binary information and a plurality of sense amplifier means coupled to said cells for reading selectable cells in response to control signals, an improved read-clock generator means for producing clock signals indicating when said sense amplifiers having stabilized during said reading comprised of:
   a. bi-stable amplifier means having inputs coupled to receive said control signals and having substantially the same architecture as said sense amplifiers for simulating during said read cycle the transient operation of said sense amplifiers, and
   b. differential voltage sensor means coupled to said bi-stable amplifier means for producing said clock signal in response to said bi-stable amplifier means becoming stable.

8. Read-clock generator means according to claim 7, wherein said sense amplifiers, said bi-stable amplifier means, and said voltage sensor means are comprised of intercoupled MOS transistors.

9. Read-clock generator means according to claim 8, wherein said bi-stable amplifier means is comprised of a set transistor cross-coupled to a reset transistor to form unbalanced set and reset nodes.

10. Read-clock generator means according to claim 9, wherein said differential voltage sensing means is comprised of a transistor having a gate coupled to said reset node and a drain coupled to said set node.

11. Read-clock generator means according to claim 8, wherein said bi-stable amplifier means is comprised of a set transistor cross-coupled to a reset transistor to form set and reset nodes, said set and reset nodes being coupled to a pair of unbalanced load transistors.

12. Read-clock generator means according to claim 11, wherein said differential voltage sensing means is comprised of a transistor having a gate coupled to said reset node and a drain coupled to said set node.

* * * * *